United States Patent [19]
Aiso

[11] Patent Number: 6,040,236
[45] Date of Patent: Mar. 21, 2000

[54] METHOD FOR MANUFACTURING SILICON THIN FILM CONDUCTIVE ELEMENT

[75] Inventor: Fumiki Aiso, Tokyo, Japan

[73] Assignee: NEC Corporation, Tokyo, Japan

[21] Appl. No.: 08/923,746

[22] Filed: Sep. 2, 1997

[30] Foreign Application Priority Data

Sep. 6, 1996 [JP] Japan .................................. 8-236020

[51] Int. Cl.[7] .................................................. H01L 21/22
[52] U.S. Cl. .......................... 438/486; 438/482; 438/507; 438/508; 438/509; 438/565
[58] Field of Search ..................... 438/482, 486, 438/507, 508, 509, 563, 565

[56] References Cited

U.S. PATENT DOCUMENTS 5,639,685  6/1997  Zahurak et al. .
5,714,415  2/1998  Oguro .

FOREIGN PATENT DOCUMENTS 6-314661  of 0000  Japan .
06097424  of 1994  Japan .
07050264  of 1995  Japan .

OTHER PUBLICATIONS

Japanese Patent Office Action with corresponding application 8–236020/1996 with the pertinent information written thereon.

*Primary Examiner*—Charles Bowers
*Assistant Examiner*—Keith Christianson
*Attorney, Agent, or Firm*—Laff, Whitesel & Saret, Ltd.; J. Warren Whitesel

[57] ABSTRACT

In a silicon conductor doped with an impurity of 100 nm or less thick, a method is provided for manufacturing a silicon thin film conductive element which can prevent the increase of resistance with a low impurity concentration. The method includes the step in which, after the formation of an impurity-containing amorphous silicon film, a crystallization is performed without removing the film from a film forming device by performing a heat treatment while flowing a gas containing the impurity.

8 Claims, 7 Drawing Sheets

FIG.1
PRIOR ART

SILICON FILM DOPED WITH PHOSPHORUS [nm]

METHOD FOR MANUFACTURING SILICON THIN FILM CONDUCTIVE ELEMENT

BACKGROUND OF THE INVENTION

1. Field of the Invention

The present invention relates to a method for manufacturing a conductive element using a thin film silicon which is to be incorporated in a semiconductor device.

2. Description of the Prior Art

Needless to say, may diverse impurity-containing silicon thin films are used in a semiconductor device. In a recently found device, the impurity-containing silicon film for use in a gate electrode of a MOS transistor has a tendency to be gradually become thinner so as not to leave a step or the like in a subsequent process.

Heretofore, a method for forming the silicon thin film doped with the impurity has been accomplished by three main methods. Each of the methods will be described below.

In a first method, a non-doped polycrystalline silicon film is formed on an insulating film such as a silicon oxide film disposed in a predetermined position on a silicon substrate. In the method for forming the polycrystalline silicon film, 200 scm of $SiH_4$ gas is normally introduced under a reduced pressure of 0.2 torr at 620° C. so as to perform a processing, thereby ending the formation of the polycrystalline silicon film. If the film formation is carried out for about ten minutes allows a polycrystalline silicon film of 100 nm thick is obtained. Next, the film is removed from a film forming device, and a phosphorus oxytrichloride gas is then introduced at 850° C. A heat treatment is performed for thirty minutes so as to introduce the impurity phosphorus. Since a phosphorus glass layer in the order of 30 nm thick, is formed on the surface of the non-doped polycrystalline silicon, the phosphorus glass is removed by means of a diluted hydrofluoric acid or the like.

In a manner as described above, the silicon film of 100 nm thick can be formed which is doped with the impurity having a phosphorus concentration of 5E20 atoms/cm$^3$ ($5\times10^{20}$ atoms/cm$^3$). This prior art is referred to as a phosphorus diffusing method. The method is a doping method causing a solid phase diffusion from the phosphorus glass layer into the polycrystalline silicon. The use of these conditions allows the achievement of the silicon thin film doped with phosphorus having a sheet resistance value of 300 Ω/sq. (a resistivity of 3E-5Ω·m, that is, $3\times10^{-5}$ Ω·m).

In a second method, by the use of the conditions as with the above-described method, the polycrystalline silicon film of 100 nm thickness is formed on the insulating film such as the silicon oxide film. An ion implantation technique is then used so as to implant the impurity such as the phosphorus at an accelerating energy of about 20–30 keV for an area density of 5E15 atoms/cm$^2$. In a manner as described above, the polycrystalline silicon film is doped with the impurity of 5E20 atoms/cm$^3$.

After the ion implantation, and in order to prevent the impurity from being eliminated from the film, the silicon oxide film or the like is formed to a thickness of the order of 50 nm. The heat treatment is then performed for about thirty minutes at 850° C. or more under a nitrogen atmosphere. After the heat treatment, the previously formed silicon oxide film is removed by the use of the diluted hydrofluoric acid or the like.

The heat treatment causes the introduced impurity ion to be activated. It is possible to obtain the silicon thin film doped with phosphorus having the sheet resistance value of about 200 Ω/sq. (the resistivity of 2E-5 Ω·m).

In a third method, after the formation of an amorphous impurity-containing silicon film, the heat treatment is performed. In this method, the silicon substrate, which has the insulating film such as an oxide film formed in a predetermined position, is exposed at 530 ° C. under the 1-torr atmosphere at flow rates of 1 SLM of silane gas (100%) and 0.2 SLM of phosphine gas (diluted with 1% nitrogen) so as to be obtained. Under these conditions, the amorphous silicon film doped with phosphorus having the phosphorus concentration of about 5E20 atoms/cm$^3$ ($5\times10^{20}$ atoms/cm$^3$) can be formed to a thickness of about 100 nm.

An atmospheric CVD method or the like is then used, so that the silicon oxide film in the order of 10 nm thick is formed on the surface of the amorphous silicon film. The heat treatment is performed for thirty minutes or more at 800 ° C., thereby causing a crystallization resulting in an electrical activation. Finally, the silicon oxide film, which is previously formed on the surface of the amorphous silicon film, is etched by the use of the diluted hydrofluoric acid or the like.

The formed silicon film doped with phosphorus can be the silicon film doped with phosphorus having the sheet resistance value of about 120 Ω/sq. (the resistivity of 1.2E-5 Ω·m).

For each of the impurity-containing silicon films formed by the above three methods, a predetermined patterning is performed in the subsequent process by means of a lithography technique and an etching technique. A conductive element is then formed.

On the other hand, the typical conductive element using the silicon thin film is, for example, the gate electrode of the MOS transistor. A recent multi-layer and high-integration of the device, uses the process of forming the element deposited on the gate electrode. When a large step is formed, the patterning using the lithography technique becomes difficult. Thus, there has been a problem that an excellent processing accuracy cannot be obtained.

Therefore, a film thickness of the gate electrode is required to be as thin as possible so as to reduce the remaining step in the subsequent process. However, the film of the gate electrode is thinned, thereby resulting in the essential increase of an element resistance. As a result, there has been another problem that an operating velocity of the transistor itself is reduced.

Accordingly, a material for the gate electrode requires the silicon film to have the lowest resistivity possible. As described above, the conductive element, which is obtained by the heat treatment of the amorphous silicon doped with phosphorus, can obtain the lowest resistivity value. In addition, the process can be performed at as low a temperature as at most about 800° C. Accordingly recently, this has been a mainstream method for manufacturing a silicon thin film conductive element such as the gate electrode.

As described above, recently, the conductive element using the silicon thin film has further required the formation of a thin film and the reduction of its resistance. However, when the film thickness is 100 nm or less, there has been a still another problem because the resistivity of the impurity-containing silicon film is quickly increased.

Figure 1:
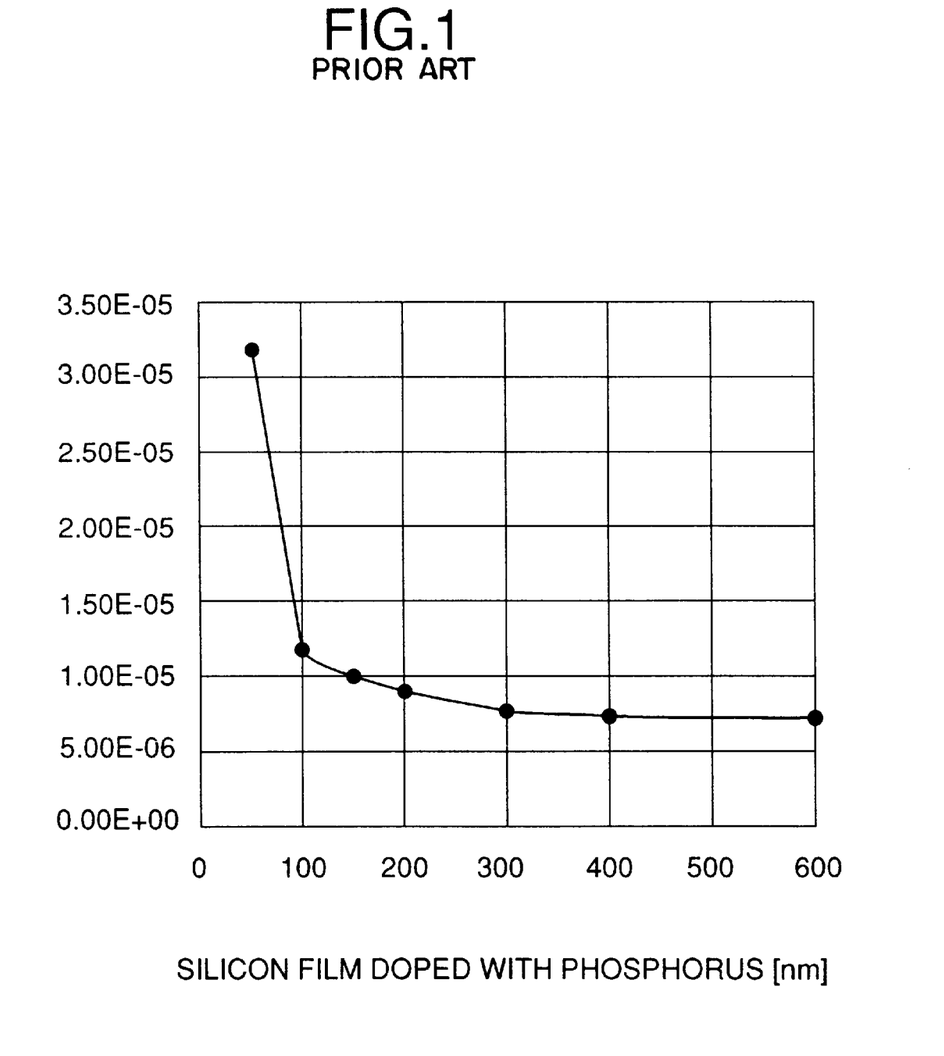
FIG. 1 is a graph showing a relationship between a film thickness and a resistivity of the prior-art silicon thin film.

FIG. 1 shows a relationship between the film thickness and the resistivity of the prior-art silicon thin film. FIG. 1 shows the relationship between the film thickness and the resistivity at the phosphorus concentration of 3E20 atoms/cm$^3$ ($3\times10^{20}$ atoms/cm$^3$).

The method for manufacturing the impurity-containing silicon thin film shown in FIG. 1 is the third method. That is, the amorphous silicon film is doped with phosphorus. Then, the heat treatment is performed at 800° C. under the nitrogen atmosphere. As seen from the drawing, when the film thickness is 150 nm or more, the resistivity is stabilized at the low value of 1E-5 Ω·m or less. On the other hand, when the film thickness is 100 nm or less, the resistivity is rapidly increased. When the film thickness is reduced to 50 nm, the resistivity is increased up to 3E-5 Ω·m. For example, the reduction-by-half of the film thickness results in the increase of the resistivity by three times. That is, this means that even the conductive element having the same designed width has the six times resistivity. This is a serious problem resulting from the reduction of film thickness of the silicon conductive element.

Figure 2:
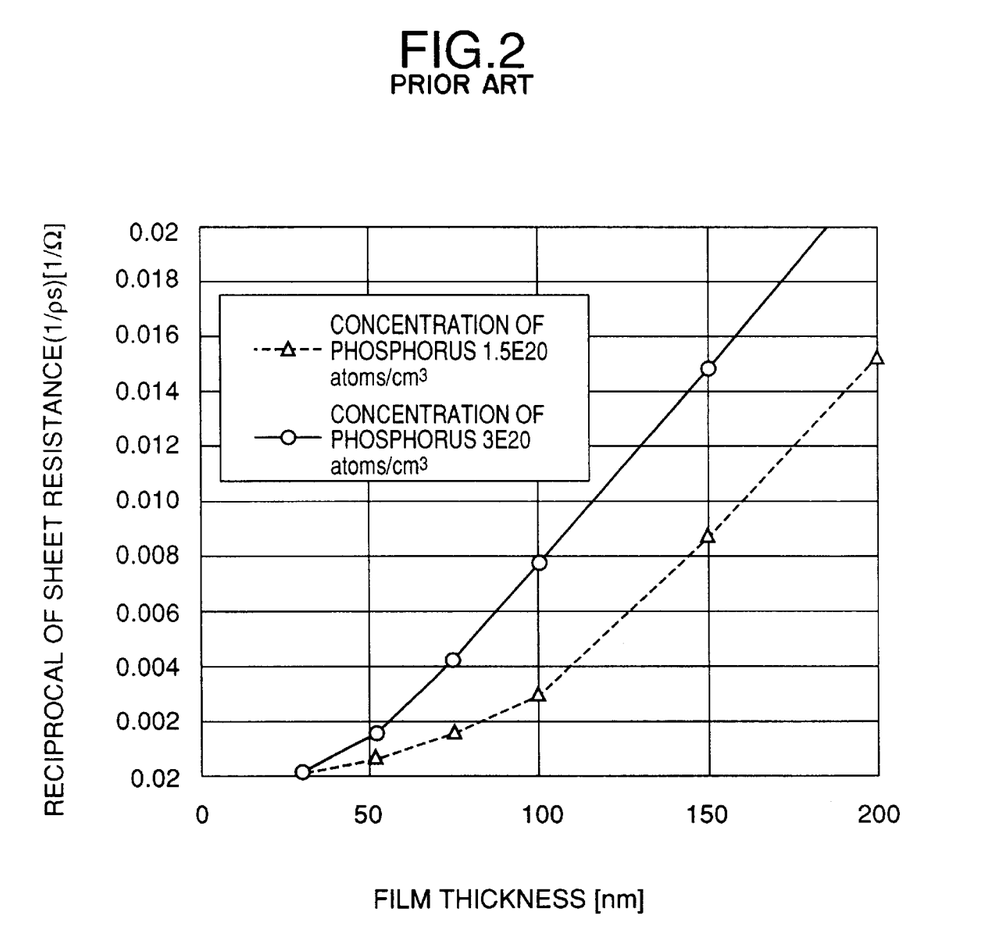
FIG. 2 is a graph showing the relationship between the film thickness and a reciprocal of sheet resistance of the prior-art silicon thin film.

FIG. 2 shows the relationship between the film thickness and a reciprocal of the sheet resistance in the prior-art silicon thin film. FIG. 2 illustrates the increase of the resistivity of the silicon thin film. In FIG. 2, there are plotted the film thickness and the reciprocal of the sheet resistance of the silicon films doped with phosphorus, one film having the phosphorus concentration of 3E20 atoms/cm$^3$ ($3 \times 10^{20}$ atoms/cm$^3$) and the other having the concentration that of 1.5E20 atoms/cm$^3$ ($1.5 \times 10^{20}$ atoms/cm$^3$).

In case of an ideal bulk of sample, the plot should be a straight line passing through an origin. However, in case of the silicon film doped with phosphorus, the plot deviates off a linearity at the position where the film thickness is less than about 100 nm. When the film thickness is thicker, the plot is substantially straight, but it does not pass through the origin. The reciprocal of the sheet resistance is zero, that is, the sheet resistance reaches an infinity at the film thickness of about 80 nm in the film having the phosphorus concentration of 1.5E20 atoms/cm$^3$ ($1.5 \times 10^{20}$ atoms/cm$^3$) and at the film thickness of about 30–40 nm in the film having the phosphorus concentration of 3E20 atoms/cm$^3$ ($3 \times 10^{20}$ atoms/cm$^3$).

The number of surface sites of a single-crystal silicon is about 1.3E15 atoms/cm$^2$. When 100% of phosphorus in the phosphorus concentration of 3E20 atoms/cm$^3$ is trapped in an interface, the phosphorus is completely trapped to a thickness of about 43 nm. Therefore, with regard to the resistance of the thin film of 100 nm or less thick, an influence of the substantially non-doped layer due to the trap in the interface is not negligible.

Measures against the increase of resistance in the thin film, are disclosed in Japanese Patent Application Laid-open No. 6-314661/1994. There has been the method that the film is doped with the impurity having the high concentration which ranges from about 5E20 atoms/cm$^3$ to 2.5E21 atoms/cm$^3$. An object of this method is to reduce the thickness of the layer which is trapped in the interface by increasing the impurity in the bulk so as to be substantially non-doped. In the thin film, the object is to introduce a supersaturated impurity in such a manner. In the thin film, such an introduction of the supersaturated impurity allows the increase of the resistivity to be suppressed.

However, with a consideration of an application of the impurity-containing silicon conductive element to the device, the method of doping with the supersaturated impurity has the problem that the impurity is diffused through the peripheral portion thereof in the subsequent heat treatment.

For example, when the silicon film doped with the supersaturated impurity up to 2E21 atoms/cm$^3$ ($2 \times 10^{21}$ atoms/cm$^3$) is applied to the gate electrode, a large amount of impurity is diffused from the gate electrode to a gate insulating film during the heat treatment for the activation of the impurity. Therefore, there is the problem that reliability of the gate insulating film is considerably deteriorated. Thus, a simple high-concentration doping method cannot be applied to an actual device. Accordingly, the silicon film is required to be the silicon film which maintains the impurity concentration of a constant value or less while having the low resistance.

Figure 3:
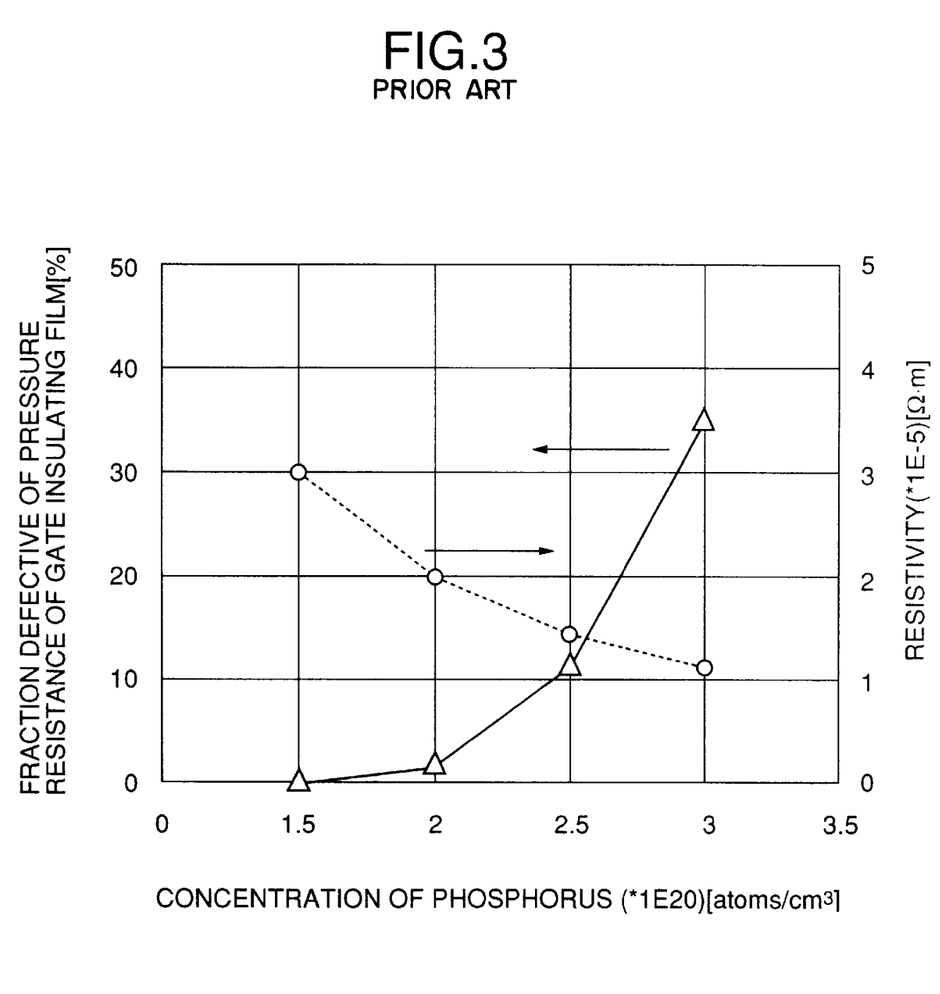
FIG. 3 is a graph showing the relationship among a phosphorus concentration, a fraction defective of pressure resistance and the resistivity of a MOS transistor using a thin film silicon gate, showing problems of the prior art.

FIG. 3 is a graph showing the relationship among the phosphorus concentration, a fraction defective of pressure resistance and the resistivity of the MOS transistor using a thin film silicon gate, showing the problems of the prior art.

In an MOS transistor (FIG. 3), the relationship is shown between the phosphorus concentration and the resistivity of the gate electrode using the silicon doped with phosphorus and a B-mode fraction defective of insulation pressure resistance of the gate insulating film. A B-mode defective, is defined as a reference in which a field strength applied to the insulating film ranges from 2 MV/cm to 8 MV/cm and there is a current of 1 mA/cm$^2$ or more.

The film thickness of the silicon film doped with phosphorus which is to be the electrode is set to 100 nm. The film thickness of the gate insulating film is set to 10 nm. When the phosphorus concentration in the gate electrode is higher than 2E20 atoms/cm$^3$ ($2 \times 10^{20}$ atoms/cm$^3$), the resistivity of the silicon film doped with phosphorus wchich is to be the gate electrode is $2E-5(2 \times 10^{31\ 5})$ Ω·m or less. This value is low and preferable.

However, it is appreciated that the fraction defective of pressure resistance of the gate insulating film is increased. On the contrary, when the phosphorus concentration is suppressed below 2E20 atoms/cm$^3$, the increase of the defective of pressure resistance can be suppressed. However, the resistivity is increased. In the gate electrode using such a silicon doped with phosphorus, it is necessary to suppress the phosphorus concentration below 2E20 atoms/cm$^3$ and to reduce the resistivity to $2E-5(2 \times 10^{31\ 5})$ Ω·m or less.

SUMMARY OF THE INVENTION

The present invention is made in view of the above points. It is an object of the present invention to provide a method for manufacturing a silicon thin film conductive element which, in a silicon conductor doped with an impurity of 100 nm or less thick, can prevent a resistance from increasing with a low impurity concentration.

In order to achieve the above object, according to the present invention, a method of manufacturing a silicon thin film conductive element comprises the step of crystallizing, after the formation of an impurity-containing amorphous silicon film, by performing a heat treatment while flowing a gas containing the impurity without removing the film from a film forming device.

According to the present invention, the formation temperature of the amorphous silicon ranges from 450 to 540° C., the temperature for the heat treatment ranges from 550 to 600° C.

According to the present invention, the impurity is phosphorus, and the impurity-containing gas is phosphine.

According to the present invention, the impurity concentration of the impurity-containing amorphous silicon film ranges from 3E19 to 2E20 atoms/cm$^3$.

According to the present invention, a method of manufacturing a silicon thin film conductive element comprises the steps of forming, after the formation of an impurity-containing amorphous silicon film, an impurity glass layer on a surface by the use of a gas containing the impurity and an oxide gas without removing the film from a film forming device; and crystallizing the amorphous silicon film by the heat treatment.

According to the present invention, the formation temperature of the impurity-containing amorphous silicon film and the deposit temperature of a silicon oxide film containing the impurity range from 450 to 540° C.

According to the present invention, the impurity is phosphorus, and the impurity-containing gas is phosphine.

According to the present invention, the oxide gas is the gas including an oxygen molecule in at least one part thereof.

According to the present invention, the impurity concentration of the impurity-containing amorphous silicon film ranges from 3E19 to 2E20 atoms/cm$^3$.

According to the present invention, the film thickness of the impurity-containing amorphous silicon film ranges from 1 to 5 nm.

DETAILED DESCRIPTION OF THE PREFERRED EMBODIMENTS

In a method for manufacturing a silicon thin film conductive element according to the present invention, an impurity-containing amorphous silicon film is formed. Without removing the film from a film forming device, a gas containing the impurity is flowed while a heat treatment is performed, so that a crystallization is carried out.

Furthermore, in the method for manufacturing the silicon thin film conductive element according to the present invention, the impurity-containing amorphous silicon film is formed. Without removing the film from the film forming device, the impurity-containing gas and an oxide gas are used so as to form an impurity glass layer on a surface. The heat treatment is then performed so as to crystallize the amorphous silicon film.

Next, embodiment of the present invention will be described with reference to the accompanying drawings.

Figure 5A:
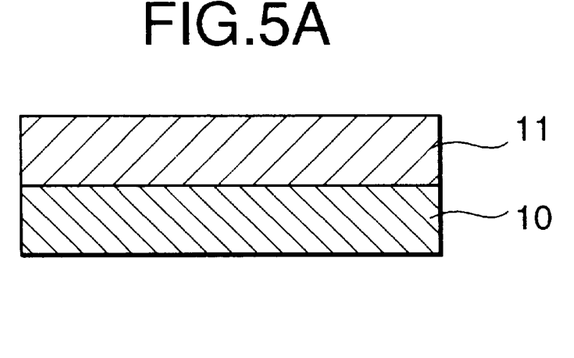
FIGS. 5A, 5B and 5C are cross-sectional views of each process of a method for manufacturing a thin film silicon conductive element, showing the embodiment of the present invention.
Figure 5B:
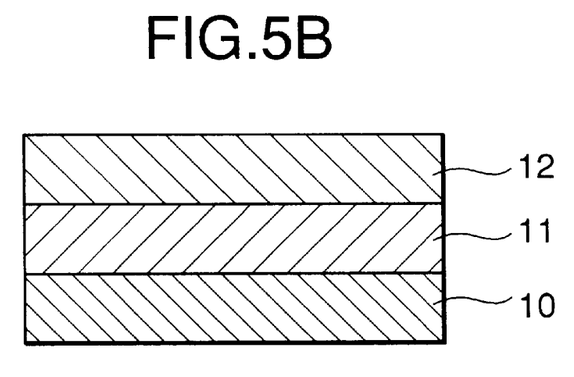
Figure 5C:
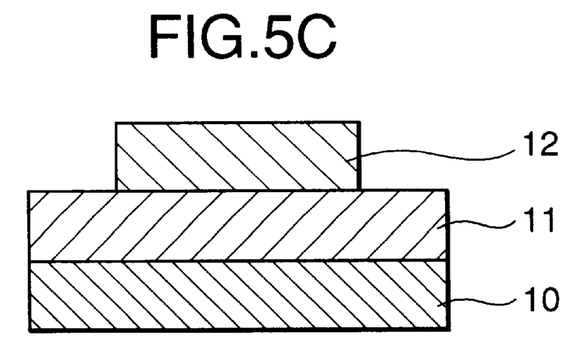

FIGS. 5A, 5B and 5C are cross-sectional views of each process of the method for manufacturing the thin film silicon conductive element, showing the embodiment of the present invention.

In a predetermined position on a semiconductor substrate 10, a silicon oxide film 11 is formed in a thickness to 10 nm (see FIG. 5A). The present invention is the method for forming the silicon conductive element. Accordingly, when the silicon conductive element is a gate electrode, the silicon oxide film 11 is a gate insulating film. In the method described below, a phosphorus-doped silicon film 12 is formed to 100 nm thick.

Figure 4A:
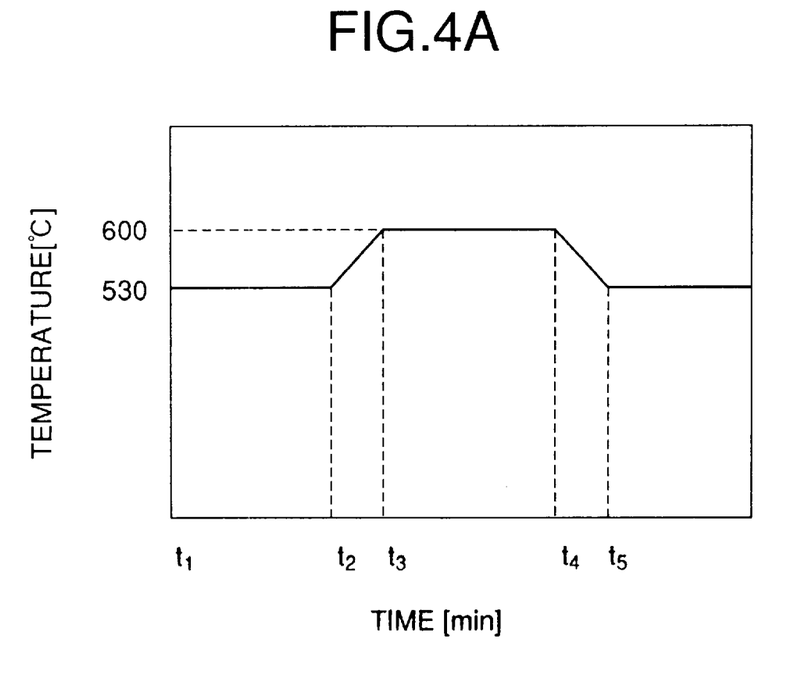
FIG. 4A shows a film-formation temperature in the growth of a silicon doped with phosphorus, showing a first embodiment of the present invention.
Figure 4B:
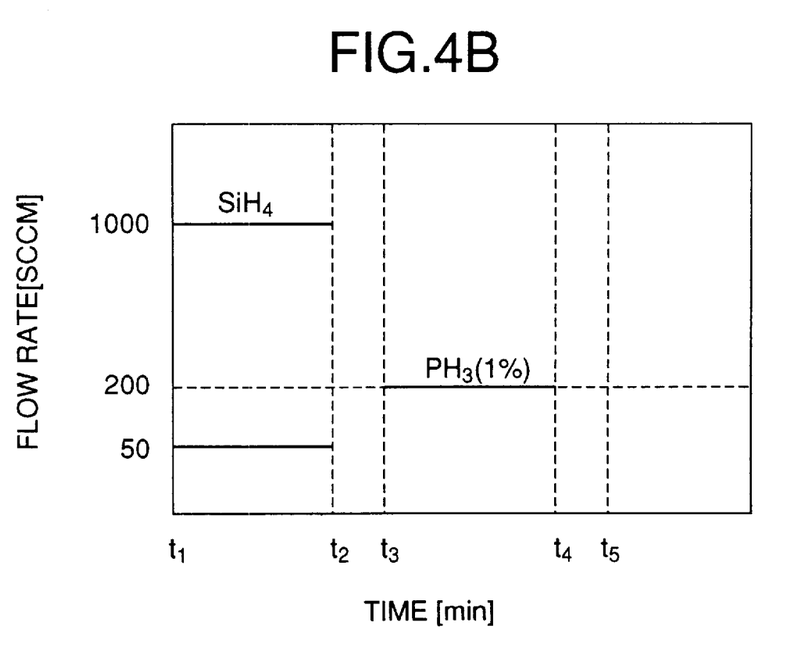
FIG. 4B shows a gas flow rate during the growth of the silicon doped with phosphorus.

FIG. 4A shows a film-formation temperature in a phosphorus-doped silicon growth, showing the first embodiment of the present invention. FIG. 4B shows a gas flow rate.

During a time period from a film-formation start (t1) to a film-formation completion (t2), the film formation is performed at the film-formation temperature of 530° C. under a pressure of 1 torr at the flow rates of 1 SLM of silane gas and 50 sccm of phosphine gas (1%) for fifty minutes. A phosphorus-doped amorphous silicon film having a phosphorus concentration of 1.5E20 atoms/cm$^3$ is formed. After then, without removing the film from a film forming device, the supply of the silane gas alone is stopped. The flow rate of the phosphine gas alone is maintained to approximately 0.2 SLM, while the temperature is increased up to 600° C. at a velocity of about 5° C./min (t2 through t3).

At the increase of temperature to 600° C., the film is held as it is for about one hour. The formed phosphorusdoped amorphous silicon film is crystallized (t3 through t4). Next, after the re-reduction of temperature to 530° C., the supply of the phosphine gas is stopped (t5). As is the case with the normal film formation, a gas purging is performed. In a manner as described above, the phosphorusdoped silicon film 12 is formed.

In the thin film silicon conductive element of the first embodiment, according to the present invention, although the phosphorus concentration is as low as 1.5E20 atoms/cm$^3$ (1.5×10$^{20}$ atoms/cm$^3$), a resistivity is suppressed to a low value of about 1.3E-5(3×10$^{31\ 5}$) Ω·M In the amorphous silicon film, as described above, the impurity is moved onto the uppermost surface or an interface with the base oxide film, thereby causing the impurity to be trapped in a surface site. Thus, an inactive layer is formed.

In the prior-art technique, a wafer, which normally forms the film formation, is left as it is for a certain time at the film-formation temperature even at the completion of the film formation. A degassing and the gas purging are performed. The inactive-layer-forming impurity seems to be moved in the film in such a step.

According to the first embodiment of the present invention, in the step of degassing and gas-purging, the phosphine gas is flowed, and the temperature is increased to a crystallization temperature. The flow of the phosphine gas is continued, so that the phosphorus is held while being absorbed on the uppermost surface. Thus, it is possible to prevent the phosphorus trapped on the surface from being eliminated from the surface. In addition, the increase of temperature causes the crystallization in an oven, thereby allowing the phosphorus near the surface to be bound in a crystal. Therefore, after the supply of the phosphine gas stop, the movement of the phosphorus in the film does not occurs.

For the above-described reason, the doped silicon film which cannot be obtained by the conventional method has the low impurity concentration in the thin film and the low resistivity.

After the formation of the phosphorus-doped silicon film 12, a lithography technique and an etching technique are used so as to perform a predetermined patterning as shown in FIG. 5. The silicon thin film conductive element can be obtained.

Next, a second embodiment will be described. The difference between the first and second embodiment is the step of forming the impurity-containing silicon film.

Figure 6A:
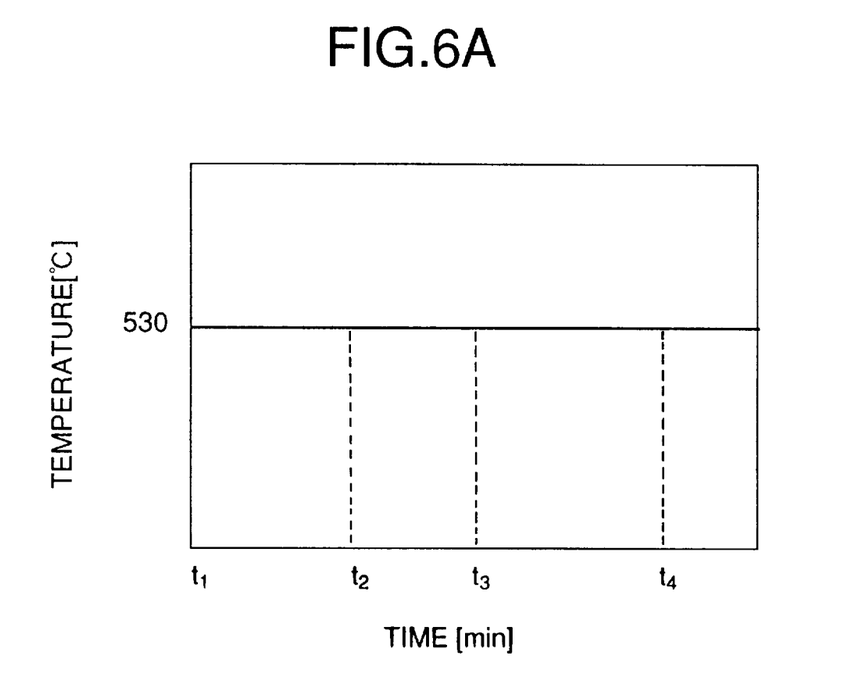
FIG. 6A shows the film-formation temperature in the phosphorus-doped silicon growth, showing a second embodiment of the present invention.
Figure 6B:
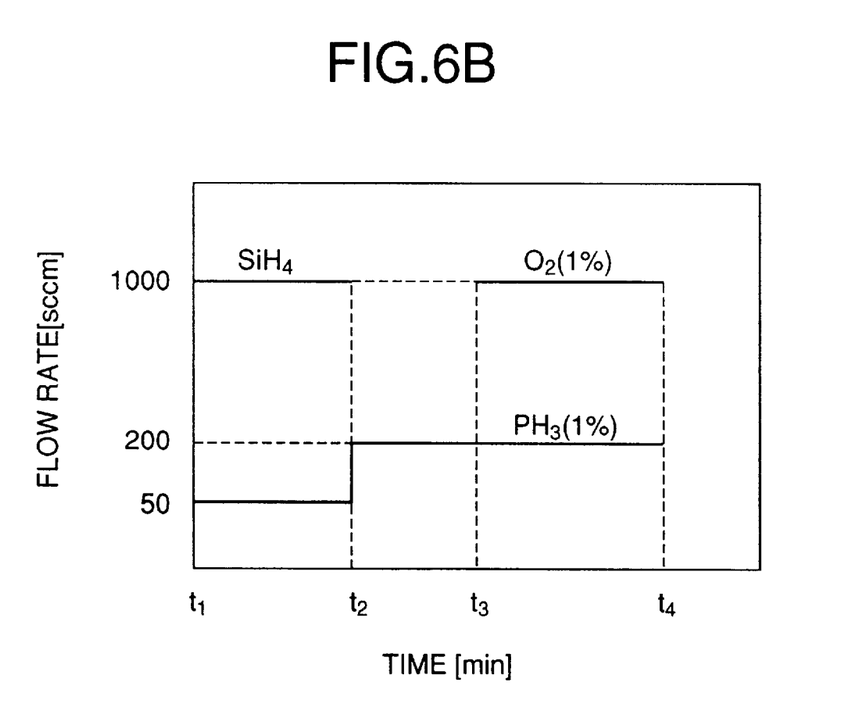
FIG. 6B shows the gas flow rate during the growth of the silicon doped with phosphorus.

FIG. 6A shows the film-formation temperature during the phosphorus-doped silicon growth, showing the second embodiment. FIG. 6B shows the gas flow rate.

During the time period from the film-formation start (t1) to the film-formation completion (t2), the film formation is performed at the film-formation temperature of 530° C. under the pressure of 1 torr at the flow rates of 1 SLM of silane gas and 50 sccm of phosphine gas (1%) for fifty minutes. The supply of the silane gas alone is stopped. The flow rate of the phosphine gas alone is maintained to approximately 0.2 SLM.

When a partial pressure of the silane gas is sufficiently reduced to 1E6torr ($1 \times 10^{31\ 6}$ torr) in a film-formation chamber (t3), the oxide gas diluted with 1% nitrogen is introduced. The film is left as it is under the pressure of 1 torr at the unchanged temperature for about thirty minutes (t3 through t4). A pipe is degassed and purged, and the film formation is completed. The introduction of the oxide gas allows a phosphorus glass layer of about 2 nm thick to be formed on the surface of the amorphous silicon film.

After the completion of the film formation, and to cause the crystallization of the amorphous silicon and the activation of the phosphorus, the film is exposed at 800° C. under a nitrogen atmosphere for about thirty minutes. The surface of the wafer is then processed by 1% diluted hydrofluoric acid for one minute.

After the removal of the phosphorus glass layer formed on the surface, a predetermined patterning formation of the conductive element is performed.

In the method, the phosphorus glass layer is subsequently formed over the amorphous silicon after the film formation. Accordingly, the above-described elimination of the phosphorus from the surface in the amorphous silicon film due to the movement of the phosphorus is difficult to occur.

In the second embodiment of the present invention, the phosphorus concentration of the amorphous silicon film is 1.5E20 atoms/cm$^3$. The resistivity thereof is about 1.9E5 Ω·m. The resistance of the second embodiment is lower than the resistance of the prior-art phosphorus-doped silicon film having the same film thickness and phosphorus concentration. This resistance value of the second embodiment is slightly higher than the resistace of the first embodiment. However, since the temperature cannot be changed in the film forming device, the problem about a film forming operation such as a film peeling is reduced. Therefore, the second embodiment is more practical than the first embodiment.

Figure 7:
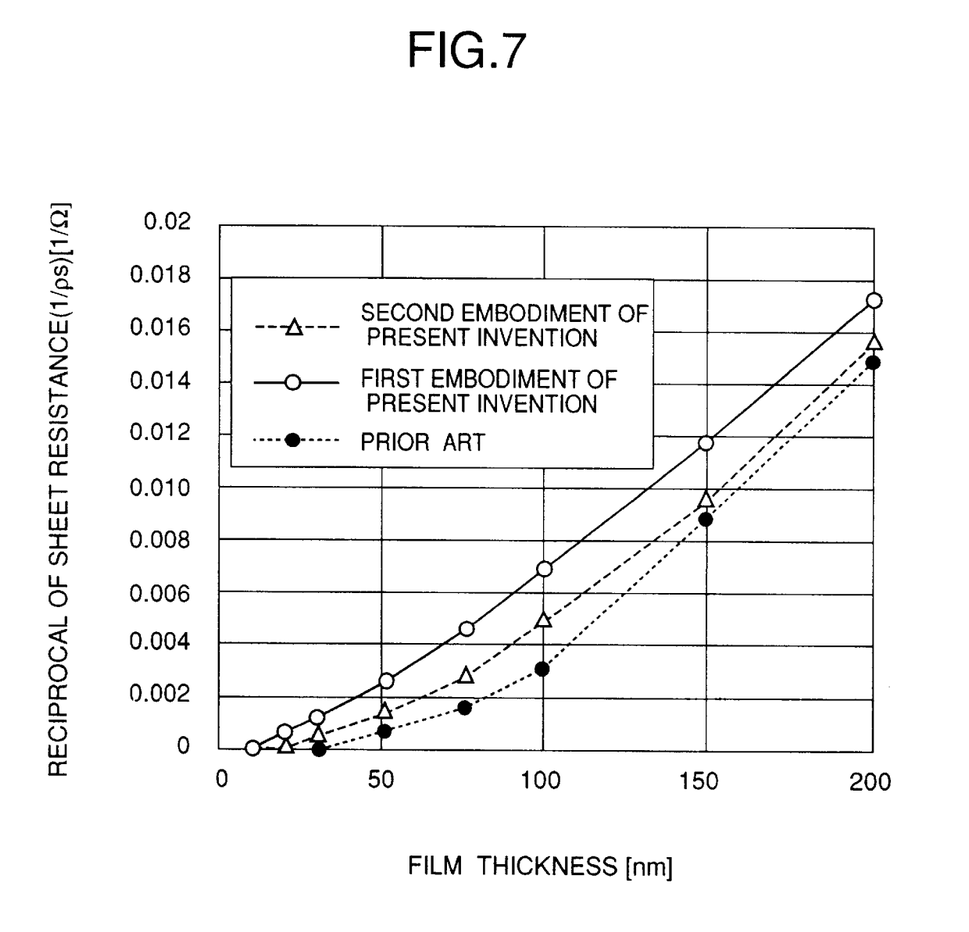
FIG. 7 is a graph showing the film thickness and the reciprocal of sheet resistance of the silicon thin film using the embodiment of the present invention.

FIG. 7 is a graph showing the film thickness and the reciprocal of sheet resistance of the silicon thin film using the embodiment of the present invention.

FIG. 7 shows the film thickness and the reciprocal of sheet resistance with the phosphorus concentration of 1.5E20 atoms/cm$^3$ in the silicon film doped with phosphorus using the prior art, the first embodiment, or the second embodiment of the present invention. In each of the embodiments of the present invention, the plot is substantially linear compared to the plot of the prior art. With the low phosphorus concentration, the low resistance value can be also obtained.

As described in the first embodiment of the present invention, although the impurity is the phosphorus, the present invention is not limited to this inpurity. When arsenic is used as the same n-type impurity and when boron such as diborane is similarly used, the gas containing the boron such as diborane may be similarly used.

In the embodiments of the present invention, although the silane is used as the film-formation gas, the present invention is not limited to silane. The silane may be replaced by disilane ($Si_2H_6$). When the disilane is used, during the film forming steps alone in the embodiments (t1 through t2 in FIGS. 4A and 4B), the film formation may be performed at the temperature of 450–490° C.

A reference character E described in the specification and drawings denotes an exponent.

As described above, according to the present invention, the impurity-containing amorphous silicon film is formed. Without removing the film from the film forming device, the impurity-containing gas is flowed, and the heat treatment is performed so as to perform the crystallization. Accordingly, in the silicon conductor doped with the impurity of 100 nm or less thick, the increase of the resistance can be prevented with the low impurity concentration.

What is claimed is:

1. A method of manufacturing a silicon thin film conductive element comprising the steps of :
    forming, after the formation of an impurity-containing amorphous silicon film, an impurity glass layer on a surface by the use of a gas containing the impurity and an oxide gas without removing the film from a film forming device; and subsequently
    crystallizing said amorphous silicon film by heat treatment.

2. The method according to claim 1, wherein the formation temperature of said impurity-containing amorphous silicon film and the deposit temperature of a silicon oxide film containing said impurity range from 450 to 540° C.

3. The method according to claim 1, wherein said impurity is phosphorus, said impurity-containing gas is phosphine.

4. The method according to claim 1, wherein said oxide gas is the gas including an oxygen molecule in at least one part thereof.

5. The method according to claim 1, wherein the impurity concentration of said impurity-containing amorphous silicon film ranges from 3E19 to 2E20 atoms/cm$^3$.

6. The method according to claim 1, wherein the film thickness of said impurity-containing amorphous silicon film ranges from 1 to 5 nm.

7. A method of manufacturing a silicon thin film conductive element comprising the steps of:
    forming an impurity-containing an amorphous silicon film at a first temperature while flowing a gas containing the impurity;
    raising said temperature to a second temperature for heat treatment of said amorphous silicon film while flowing the gas containing the impurity; and
    crystallizing said amorphous silicon film.

8. The method according to claim 7, wherein said first temperature is about 450 to 540° C. and the second temperature is about 550 to 600° C.

* * * * *